Sept. 27, 1966 YASUO MATSUKURA ET AL 3,275,906

MULTIPLE HETERO-LAYER COMPOSITE SEMICONDUCTOR DEVICE

Filed Aug. 14, 1963

INVENTORS
YASUO MATSUKURA
JOJI ODA

BY Haygord & Calimafde
ATTORNEYS

United States Patent Office 3,275,906

Patented Sept. 27, 1966

3,275,906

MULTIPLE HETERO-LAYER COMPOSITE SEMICONDUCTOR DEVICE

Yasuo Matsukura and Jyoji Oda, Tokyo, Japan, assignors to Nippon Electric Company Limited, Tokyo, Japan, a corporation of Japan Filed Aug. 14, 1963, Ser. No. 302,063
Claims priority, application Japan, Aug. 20, 1962, 37/35,895
2 Claims. (Cl. 317—234)

This invention relates to semiconductor devices and in particular the arrangement of constituents therein.

Conventional semiconductor devices are constructed of a single semiconductor type, for example, silicon or germanium, in which different conduction type regions are formed by the inclusion of specific impurities. It is natural, therefore, that the characteristic of the semiconductor device is defined and limited by the physical character of the semiconductor material employed. For example, the rectification efficiency of a rectifier or injection efficiency of a transistor has a maximum theoretically derived value which can not be exceeded for one type semiconductor.

Hence, it is the object of this invention to provide a novel semiconductor device in which the aforesaid limits are obviated and which may have characteristics determined by the order of the stacking combination, the geometric dimensions, and the physical nature of greater than one semiconductor type.

Briefly, the invention is predicated upon the use of multiple hetero-layers of semiconductor material, that is two or more layers of different semiconductor type, produced by the well-known epitaxial growth method.

Figure 1A:
Figure 1B:
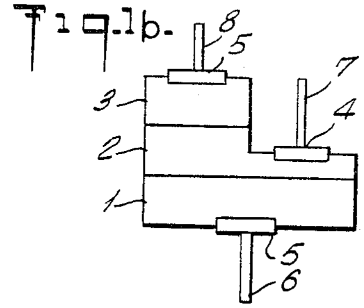

The above mentioned and other features and objects of this invention and the manner of attaining them will become more apparent and the invention itself will best be understood by reference to the following description of an embodiment of the invention taken in conjunction with the accompanying drawings wherein:

FIGURE 1*a* shows multiple hetero-layer semiconductor body of the present invention;

FIGURE 1*b* illustrates a sectional view of a transistor in accordance with the present invention; and FIGURES 2*a* to 4*b* inclusive, show embodiments of the invention in the forms of a drift transistor, a switching diode and a controlled rectifier, respectively.

Referring now to FIGURE 1, a multiple hetero layer semiconductor body according to the invention is shown. It is produced by forming a p-type Si-Ge alloy semiconductor layer 2 on the n-type Si plate 1, and an n-type Si layer 3 upon layer 2 by the epitaxial method; thus forming an n-p-n multiple hetero-layer semiconductor plate. The boundaries between n-type Si plate 1 and p-type Si-Ge alloy semiconductor layer 2, and between said layer 2 and the n-type Si layer 3 are termed hetero-p-n junctions. When a part of layers 2 and 3 shown in FIGURE 1*a* is removed by etching; the leads 6 and 8 are attached to the portions 5, which are produced by alloying AuSb on layers 1 and 3; and the lead 7 is attached to portion 4, formed of alloyed Al, a transistor is obtained.

In the above described transistor, the injection of minority carriers (electrons) from the emitter to the base will be determined by the character of the hetero-junction between the n-type Si and the p-type Si-Ge layers, in other words by the physical nature of the semiconductor materials at the junction. That is, the injected minority carriers will pass through the Si-Ge layer and will attain the hetero-junction existing between Si-Ge layer 2 and n-type Si layer 1. The collector efficiency may also be determined by the physical nature of the aforesaid layers 1 and 2. Thus, the current amplification factor of the transistor in accordance with this invention will become greater than the theoretical value of conventional transistor constructed with either Si or Ge alone.

Figure 2A:
Figure 2B:
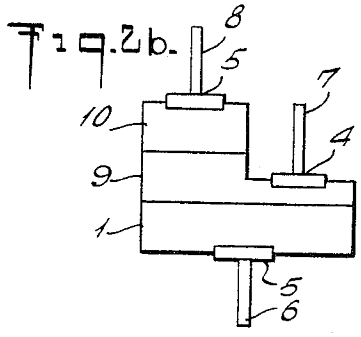

FIGURE 2 shows a drift transistor embodying the present invention in which a p-type Si-Ge alloy semiconductor layer 9 is grown on the n-type Si plate 1. In this case, as opposed to the device of FIGURE 1 which has uniform distribution, the layer 9 is formed so as to gradually increase the Ge content in the Si-Ge layer. An n-type layer 10 having a Ge concentration equal to that on the upper part of the Si-Ge alloy layer 9 is then formed on it. A transistor, using this n-p-n multiple hetero-layer, and with leads attached and surfaces etched similar to the transistor shown in FIGURE 1*b*, possesses a drift field because of the gradual variation in distribution of Si and Ge in the base region, resulting in the variation of the forbidden band width. The drift field of the transistor in accordance with the invention is greater than that of a conventional drift transistor, and exists even under a high current density condition.

Figure 3A:
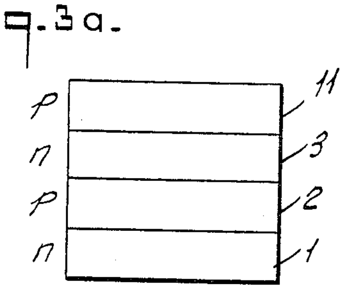
Figure 3B:
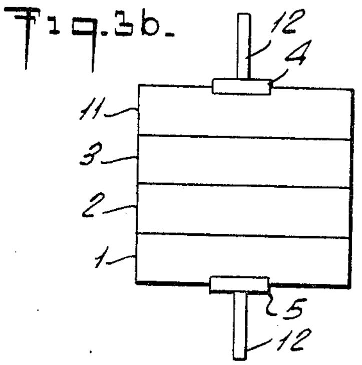

FIGURE 3 illustrates another embodiment of the invention which may constitute a switching diode. Here, a p-type Si-Ge alloy semiconductor layer 2, n-type Si layer 3 and p-type Si layer 11 are disposed on the n-type Si plate, one after another, again by the epitaxial growth method. Subsequently, ohmic contacts AuSb(5) and Al(4) may be provided to the layers 1 and 11 respectively by vacuum evaporating and alloying, and finally lead wires 12 attached. The p-n-p-n switches because it is made using the epitaxial growth method, and since each junction is a hetero-junction, leakage current in the case of reverse bias voltage is very small, and switching "on" resistance is low; the device consequently possessing excellent switching characteristics.

Figure 4A:
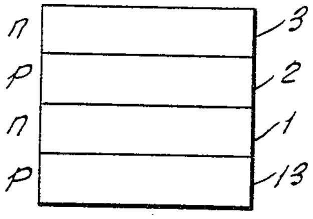
Figure 4B:
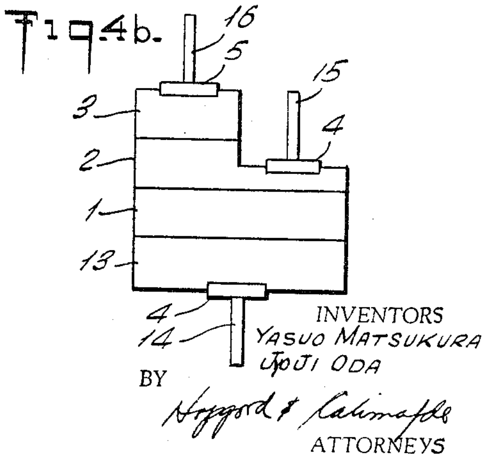

A controlled rectifier is shown in FIGURE 4. Here, layers 1, 2 and 3 and the contacts and leads thereto are similar to those shown in FIGURE 1. In this case, however, an additional p-type Si-Ge alloy layer 13 is attached to the lower side of the layer 1 and is provided with an anode lead 14, via the Al alloyed portion 4. In this embodiment, hetero-junctions are formed between layers 1 and 2, 2 and 3, and 1 and 13, the gate current flows through the hetero-junction between layers 2 and 3, and the main current flows through the hetero-junctions between layers 2 and 3, and 1 and 13 in the forward direction, so that the gate current and holding current are smaller than those of conventional devices of this type, made of Si.

While we have described above the principles of our invention in connection with specific arrangements, it is to be clearly understood that this description is made only by way of example and not as a limitation to the scope of our invention as set forth in the objects thereof and in the accompanying claims.

We claim:

1. In a semiconductor device having a plurality of layers of semiconductor material produced by the epitaxial growth method and in which contiguous layers are of opposite conductivity type; an intermediate layer in said device composed of alloyed Si and Ge of one conductivity type, said intermediate layer being bounded on both sides by layers of Si of a conductivity type opposite said one type, and a further layer of alloyed Ge and Si contiguous one of said opposite conductivity layers of Si.

2. In a semiconductor device having a plurality of layers of semiconductor material produced by the epitaxial growth method; an intermediate layer in said device composed of alloyed Si and Ge, said layer having a gradually increasing concentration of Ge in the direction of layer growth, and said layer being bounded on the side of least Ge concentration by an opposite conductivity layer of Si, and on the side of greatest Ge concentration by an opposite conductivity layer comprising Ge in a concentration equal to the concentration of Ge in the intermediate layer at the adjacent boundary.

References Cited by the Examiner

UNITED STATES PATENTS

| | | | |
|---|---|---|---|
| 2,840,497 | 6/1958 | Longini | 148—1.5 |
| 2,966,434 | 12/1960 | Hibberd | 148—33 |
| 3,102,828 | 9/1963 | Courvoisier | 117—227 |
| 3,206,612 | 9/1965 | Swanekamp et al. | 307—88.5 |
| 3,211,970 | 10/1965 | Christian | 317—235 |

JOHN W. HUCKERT, *Primary Examiner.*

M. EDLOW, *Assistant Examiner.*